United States Patent [19]
Onodera et al.

[11] Patent Number: 5,204,626
[45] Date of Patent: Apr. 20, 1993

[54] METHOD FOR NUCLEAR MAGNETIC RESONANCE MEASUREMENTS ON LOW CONCENTRATION SOLUTES IN SOLVENT

[75] Inventors: Yukari Onodera, Hachioji; Etsuji Yamamoto, Akishima; Ryuichi Suzuki, Kokubunji, all of Japan

[73] Assignee: Hitachi, Ltd., Tokyo, Japan

[21] Appl. No.: 751,972

[22] Filed: Aug. 29, 1991

[30] Foreign Application Priority Data
Aug. 29, 1990 [JP] Japan .................................. 2-225224

[51] Int. Cl.$^5$ ............................................ G01R 33/20
[52] U.S. Cl. ...................................... 324/309; 324/312
[58] Field of Search ............... 324/300, 308, 307, 309, 324/310, 311, 312, 318, 322; 128/653.2, 653.5

[56] References Cited
U.S. PATENT DOCUMENTS
4,521,732 6/1985 Pegg et al. ......................... 324/312

Primary Examiner—Michael J. Tokar
Attorney, Agent, or Firm—Antonelli, Terry, Stout & Kraus

[57] ABSTRACT

NMR signals of low concentration solutes are obtained with suppression of NMR signal of solvent by sequentially applying a first RF pulse sequence, a 180° RF pulse and a second RF pulse sequence to an object. Each of the first and second RF pulse sequence includes equally spaced RF pulses which have flip angles in accordance with binominal coefficients. Phase errors due to inhomogeneity of a static magnetic field are cancelled through the two-time application of equally spaced RF pulse sequence.

12 Claims, 14 Drawing Sheets

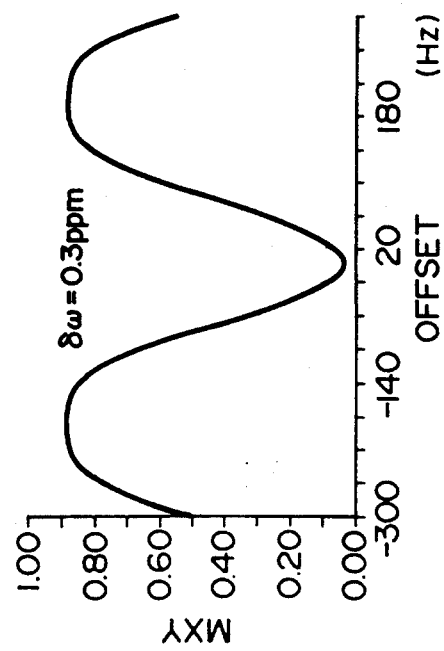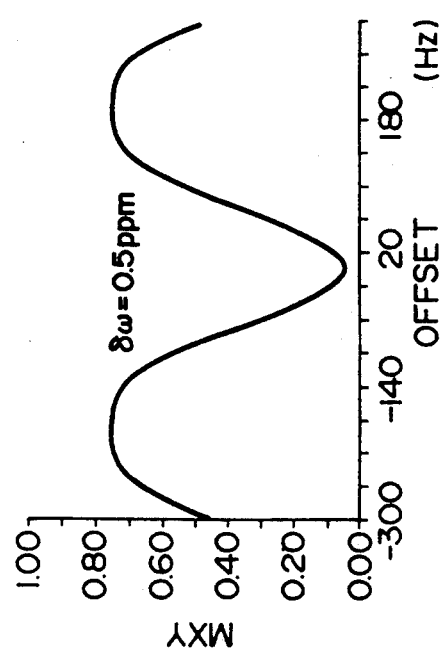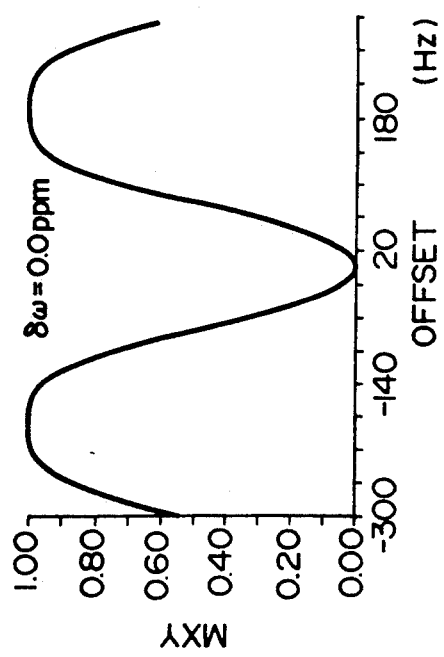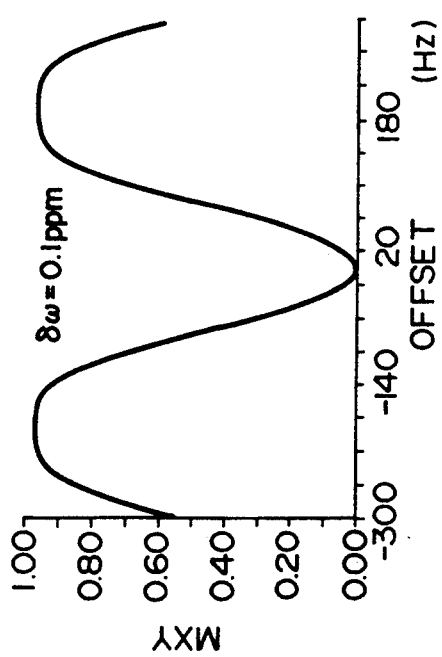

METHOD FOR NUCLEAR MAGNETIC RESONANCE MEASUREMENTS ON LOW CONCENTRATION SOLUTES IN SOLVENT

BACKGROUND OF THE INVENTION

This invention relates to method of measuring internal data of an object using Fourier transform nuclear magnetic resonance, and more particularly to a method of suppressing signals of a solvent having a large signal quantity which will otherwise impede measurements of signals of low concentration solutes in the solvent such as lactic acid, amino acid, etc., in a living body.

In a system wherein low concentration solutes and a solvent co-exist, the peaks of nuclear magnetic resonance signals of low concentration solutes are hidden at the skirt of the large peak of the solvent molecule and for this reason, the signals of the solvent molecule must be suppressed. This signal suppression can be achieved by a method which saturates nuclear magnetizations of the solvent molecule by utilizing the difference of chemical shifts and a method which observes selectively the signals of multiple quantum transition and suppresses single quantum transition of the solvent molecule. Of these, the method which has gained the widest application in the past is the one that applies a plurality of radio frequency pulses the degree of flip angles of which becomes a ratio of binominal coefficients, with suitable pulse intervals by utilizing the phase difference of the solvent molecule and the low concentration solute molecules after excitation, and excites only the nuclear magnetizations of the low concentration solute molecules. The method of saturating the nuclear magnetization of the solvent molecule by utilizing the difference of the chemical shifts is described in R. L. Vold et al "Measurement of Spin Relaxation in Complex Systems" (J. Chem. Phys., 48, pp. 3831 (1968), and the method of suppressing the single quantum transition of the solvent molecule by observing selectively the signals of the multiple quantum transition is described in C. L. Dumoulin "A multiple Quantum Filter for the Imaging of Homonuclear Spin-Spin Coupled Nuclei", (Proceedings of the Fourth Annual Metting of the Society of Magnetic Resonance in Medicine, London, pp. 145 (1985).

In accordance with the method which applies a plurality of radio frequency pulses the degree of flip angles of which becomes a ratio of binominal coefficients, with suitable pulse intervals by utilizing the phase difference of the solvent molecule and the low concentration solutes after excitation and excites only the nuclear magnetizations of the low concentration solute molecules, pulse sequences can exist infinitely in accordance with the number of terms of binominal coefficients. FIG. 2 shows a measuring method using a pulse sequence comprising radio frequency pulses having a flip angle ratio of 1:-3:3:-1, which is described in "Journal of Magnetic Resonance", 55, pp. 283-300 (1983), by way of example.

If the effect of relaxation is neglected, the observation signal becomes maximal when the sum of the effective flip angles is $\pi/2$. In this case, therefore, the flip angle of the first pulse '1' in the pulse sequence described above is $\pi/16$. When the measuring method described above is employed under this condition, the trajectory of the nuclear magnetization vector in a rotating coordinates system which rotates with a frequency equal to the frequency of the radio frequency pulses is shown in FIG. 3A and the trajectory of the nuclear magnetization of the low concentration solutes in which the sum of the effective flip angles becomes $\pi/2$ is shown in FIG. 3B. Here, the direction of the static magnetic field is a z direction and the phases of the radio frequency pulses are those which rotate the magnetization with the x axis of the rotating coordinates system being its axis of rotation. The frequency of the radio frequency pulses is equal to the resonance frequency of the solvent molecule.

In FIG. 2, the nuclear magnetizations of both solvent molecule and low concentration solutes exist inside a y - z plane immediately after the application of the pulse '1' and the angle between the z axis and the nuclear magnetizations is $\pi/16$. The pulses are spaced a part from one another with a pulse interval time $\tau$ and during this time $\tau$, a phase difference in accordance with the frequency difference of the precession occurs between the nuclear magnetization of the solvent molecule and that of the low concentration solutes. In the nuclear magnetizations shown in FIG. 3B, this phase difference is $\pi$. The nuclear magnetization of the solvent molecule receives a flip of $-3\pi/16$ immediately after the application of the pulse '-3', so that the angle between the z axis and the nuclear magnetization of the solvent molecule is $-2\pi/16$. On the other hand, since the net flip the nuclear magnetizations of the low concentration solutes receives by the pulse '-3' is $3\pi/16$, the angle between the z axis and the nuclear magnetizations of the low concentration solutes is $4\pi/16$.

Next, when a pulse '3' is applied after the passage of the pulse interval time $\tau$, the angle between the z axis and the nuclear magnetization of the solvent molecule is $\pi/16$ and the angle between the z axis and the nuclear magnetizations of the low concentration solutes is $7\pi/16$. Furthermore, when a pulse '-1' is applied after the pulse interval time $\tau$, the angle between the z axis and the nuclear magnetization of the solvent molecule becomes finally zero and the solvent signal is no longer observed. On the other hand, the angle between the z axis and the nuclear magnetizations of the low concentration solutes is $8\pi/16 = \pi/2$ and the observation signal becomes maximal.

This measuring method has the advantages that the suppression effect of the solvent signal is relatively high and that when a pulse sequence comprising even-numbered radio frequency pulses is used, the suppression effect of the solvent signal is not adversely affected even when inhomogeneity of the radio frequency magnetic field exists.

SUMMARY OF THE INVENTION

From our investigation, it becomes clear that the prior art technique described above is not free from the problems that when inhomogeneity of the static magnetic field is great. Namely, a correct phase manipulation is not possible when the static magnetic field is inhomogeneous and the suppression effect of the solvent signal as well as the observation signal quantity drop.

With the background described above, the present invention is directed firstly to provide a nuclear magnetic resonance inspection method which provides a sufficient suppression effect of a solvent signal even when inhomogeneity of a static magnetic field exists.

It is another object of the present invention to provide a nuclear magnetic resonance inspection method which can obtain transverse magnetization signals of low concentration solutes with a sufficient intensity even when homogeneity of a static magnetic field exists.

The present invention provides a nuclear magnetic resonance measuring method which is characterized by the steps of applying a first, equally spaced radio frequency pulse sequence the phases of which are inversed sequentially and which has a flip angle ratio in accordance with binominal coefficients to an object; applying consecutively a 180° radio frequency pulse to the object; applying a second, equally spaced radio frequency pulse sequence the phases of which are inversed sequentially in the same way as the first pulse sequence described above and which has a flip angle ratio in accordance with binominal coefficients; and measuring the resulting transverse relaxation signals from the object.

The equally spaced radio frequency pulse sequence whose phases inverse sequentially and has a flip angle ratio in accordance with binominal coefficients has the functions of returning the nuclear magnetization having by itself the nuclear magnetic resonance frequency equal to the frequency of the radio frequency pulses to a thermal equilibrium state and flipping the nuclear magnetizations having the chemical shifts from this resonance frequency to generate the transverse magnetizations. Accordingly, such a pulse sequence is used for a nuclear magnetic resonance measuring method which suppresses the solvent signals and obtains the signals of the low concentration solutes. However, if any inhomogeneity exists in the static magnetic field which is applied to the object sample, variance occurs in accordance with the frequency of precession of the magnetizations. For this reason, the magnetization of the solvent molecule does not return to the direction of the thermal equilibrium state and the suppression effect of the signals of the solvent molecule becomes insufficient. The magnetizations of the low concentration solutes to be flipped are dephased in accordance with positions, so that the intensity of the resonance signal to be measured drops. In accordance with the pulse sequence of the present invention, on the other hand, the precession components generated by the application of the first equally spaced radio frequency pulses are offset by the application of the 180° radio frequency pulse and the second equally spaced radio frequency pulses. Accordingly, the suppression effect of the signals of the solvent molecule can be improved. The magnetizations of the low concentration solutes to be flipped are rephased by the application of the 180° radio frequency pulse and the second equally spaced radio frequency pulse sequence, so that the signals of the low concentration solutes can be measured with a high intensity.

These first and second radio frequency pulse sequences can be combined in an arbitrary manner from those pulse sequences in which the flip angle ratio of each of their pulses can be expressed by 1 $\bar{2}$ 1, 1 $\bar{3}$ 3 $\bar{1}$, 1 $\bar{4}$ 6 $\bar{4}$ 1, 1 $\bar{5}$ 10 $\overline{10}$ 5 $\bar{1}$, and so forth. To obtain effectively the suppression effect of the solvent signals by the error offset and the improvement in the low concentration solute signals, however, the pulse sequences having the same number of pulses or having a difference of 1 of their pulse numbers must be combined with each other. To obtain the greatest effect, furthermore, the sum of the absolute values of the flip angles of the pulses of the first radio frequency pulse sequence should be preferably equal to the sum of the absolute values of the flip angles of the pulses of the second radio frequency pulse sequence. To obtain the transverse magnetization signals of the low concentration solutes, the sum of the absolute values of the flip angles of all the pulses of the first and second radio frequency pulse sequences should be preferably $\pi/2$.

BRIEF DESCRIPTION OF THE DRAWINGS

FIGS. 11A to 11D are diagrams of the transverse magnetizations measured by another conventional method in accordance with the degree of inhomogeneity of the static magnetic field.

DESCRIPTION OF THE PREFERRED EMBODIMENTS

Figure 4:
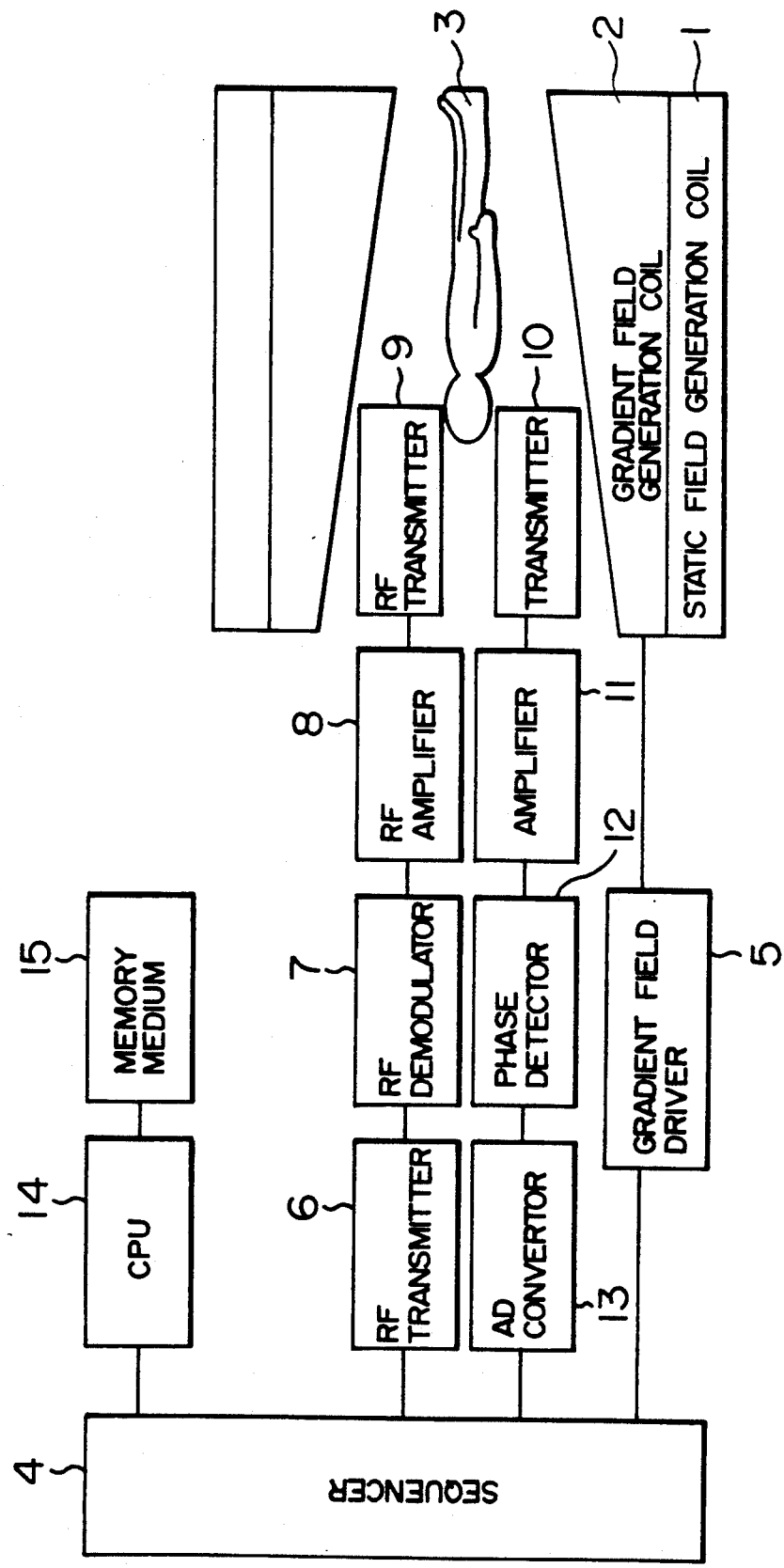
FIG. 4 is a block diagram of a nuclear magnetic resonance inspection apparatus for use in the embodiment of the present invention.

FIG. 4 is a structural view of a nuclear magnetic resonance inspection apparatus for obtaining signals of low concentration solutes from a sample containing large quantities of solvent molecules and low concentration solutes in accordance with an embodiment of the present invention. This sample 3 of inspection is placed in an internal space of a coil 1 for generating a static magnetic field and a gradient coil 2 for generating a gradient magnetic field. A sequencer 4 sends instructions to a gradient magnetic field driver 5 and to an RF (Radio Frequency) transmitter 6 and applies the gradient magnetic filed and the RF (Radio Frequency) magnetic field. The RF magnetic field is applied to the inspection object 3 through an RF modulator 7 and an RF amplifier 8. The signals generated from the inspection object are received and detected by a receiver 10 and are sent through an amplifier 11, a phase detector 12 and an A/D convertor 13 to a CPU 14, where they are subjected to signal processing. These signals and the measuring condition may be stored in a memory medium 15, whenever necessary.

The generation of the gradient magnetic field by the gradient coil described above is effected so as to limit the signal generation range and to apply position data to the signals. Essentially, however, the gradient magnetic field is not indispensable for the detection of the low concentration solute signals after the suppression of solvent signals. In other words, the explanation of the embodiment will be given on the premise that the object 3 is placed in the space to which a static magnetic field having a field intensity Ho and inhomogeneity of position is applied.

More definitely, the object 3 is a living body and the signals to be measured are NMR signals of proton in this embodiment. In other words, a $^1H$ spectrum is measured. When this measurement is carried out, the signals of proton of the water molecule, which is contained in predominantly greater quantities in the living body, are suppressed and signals of protons of low concentration solutes, which have biochemically very important meaning, such as lactic acid and amino acids, are taken out. For example, the static field intensity Ho is 2.0 T, and the signals of the low concentration solutes whose resonance frequency has a difference of from about 80 to about 300 Hz from water are the objects of measurement.

Figure 1:
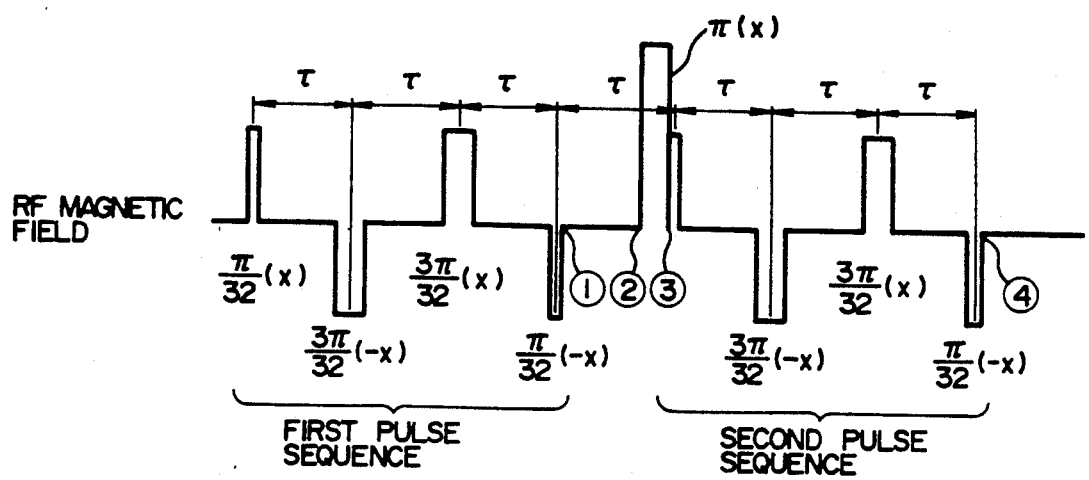
FIG. 1 is a timing chart for the application of radio frequency pulses in accordance with an embodiment of the present invention.

FIG. 1 shows the pulse sequence that is employed in this embodiment. This pulse sequence comprises first and second pulse sequences spaced apart by a time $\tau$ and inversion pulses $\pi(x)$. Each of the pulse sequences comprises four RF pulses whose phases inverse sequentially with flip angle ratios of 1:-3 and 3:-1. The signals are measured after the application of the last pulse of the second pulse sequence. These RF pulses have the frequency equal to the resonance frequency of the proton with respect to the static magnetic field intensity Ho, and the individual pulse interval in each pulse sequence is $\tau$.

If this pulse interval time $\tau$ is set to 2.6 msec, nuclear magnetization having the difference of the resonance frequency of about 190 Hz with that of water provides the maximum signal intensity.

The pulse width of each pulse is set so as to be sufficiently shorter than the pulse interval time $\tau$, and is about a dozen of micro-seconds, for example.

When the sum of the absolute values of the flip angles of the pulses in each of these first and second pulse sequences is set to $\pi/4$, or in other words, if each of the first and second pulse sequences the sum is set to $\pi/32(x) - 3\pi/32(-x) - 3\pi/32(x) - \pi/32(-x)$ as shown in the drawing, the most remarkable effect of suppressing the solvent signals and emphasizing the low concentration solute signals can be obtained. The behavior of the nuclear magnetizations in this case will be hereinafter explained.

Figure 3A:
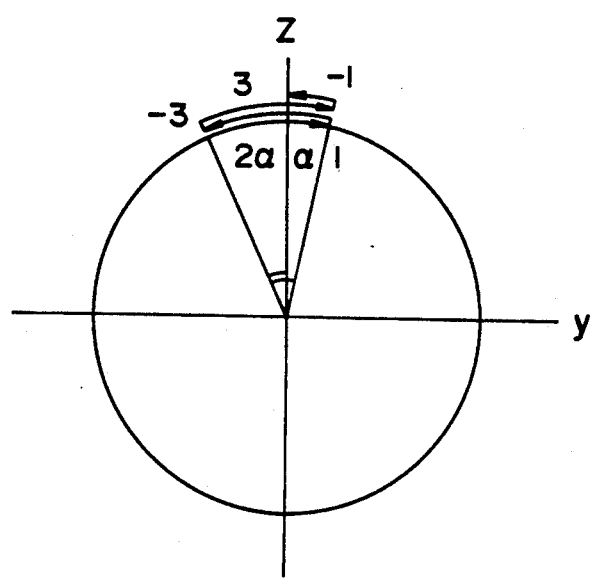
FIGS. 3A and 3B show the trajectories of nuclear magnetization vectors of the solvent molecule and low concentration solutes in an example of the conventional method.
Figure 3B:
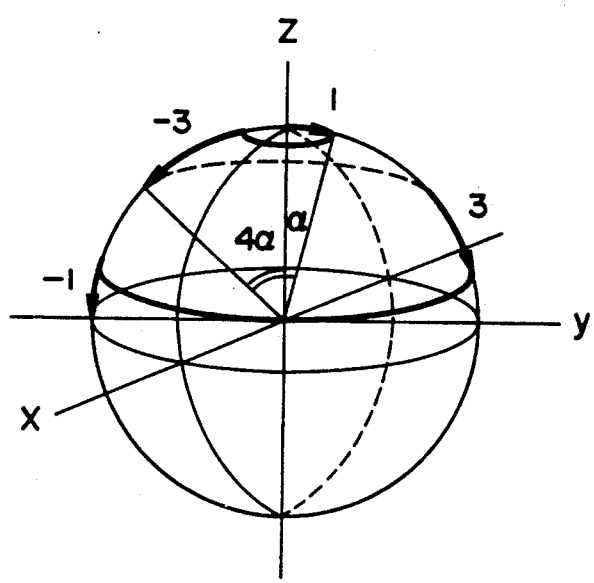

Due to the application of the first pulse sequence, the net flip angle the nuclear magnetizations W of water receive are ideally zero, and the direction of W should return to the application direction Z of the static magnetic field or to the thermal equilibrium state (see FIG. 3A). In practice, however, variance occurs in the phase of the nuclear magnetizations W because inhomogeneity of the static magnetic field exists, and the transverse magnetization components remain as error components. If the inversion pulse is applied after the passage of time $\tau$ from the application of the first pulse sequence, the transverse magnetization components occur in such a direction as to offset the error components by the second pulse sequence that is consecutively applied. Accordingly, when the application of the second pulse sequence is completed, the nuclear magnetizations W of water direct substantially completely in $-Z$ direction. In other words, the NMR signals of the proton of the water molecule are remarkably suppressed at the time of signal measurement even if inhomogeneity of the electrostaitc magnetic field exists.

Figure 5A:
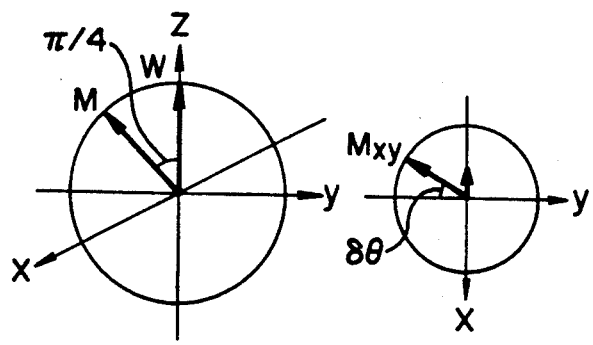
FIGS. 5A to 5D show the trajectories of the nuclear magnetization vectors of the low concentration solutes in the embodiment of the present invention.
Figure 5B:
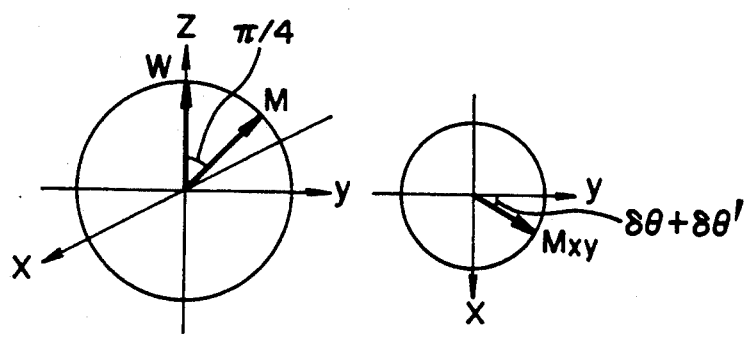
Figure 5C:
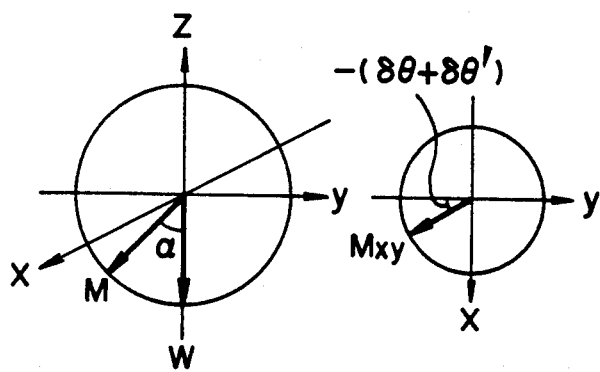
Figure 5D:
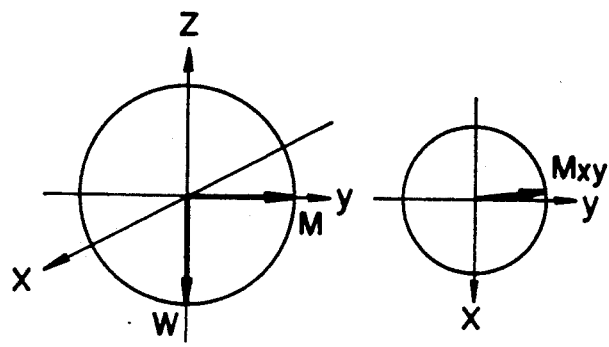
Figure 6A:
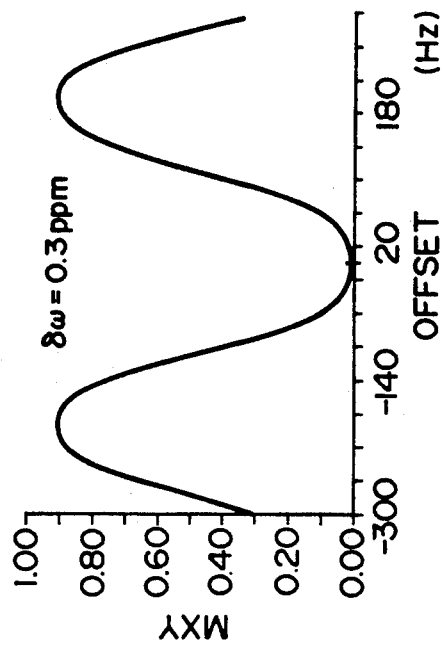
FIGS. 6A to 6D are diagrams of the transverse magnetizations measured in accordance with the degree of inhomogeneity of a static magnetic field in the embodiment of the invention.
Figure 6C:
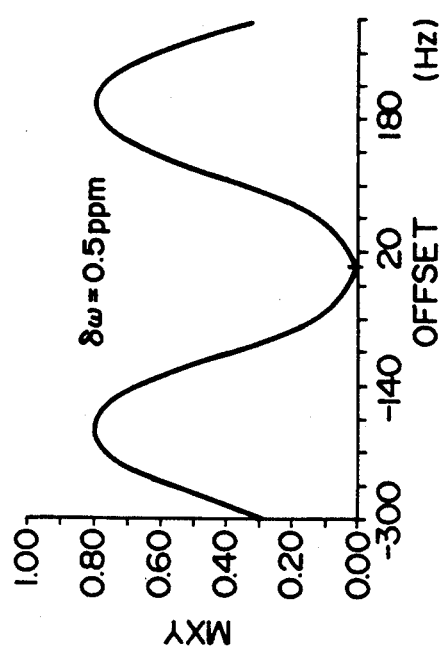
Figure 6B:
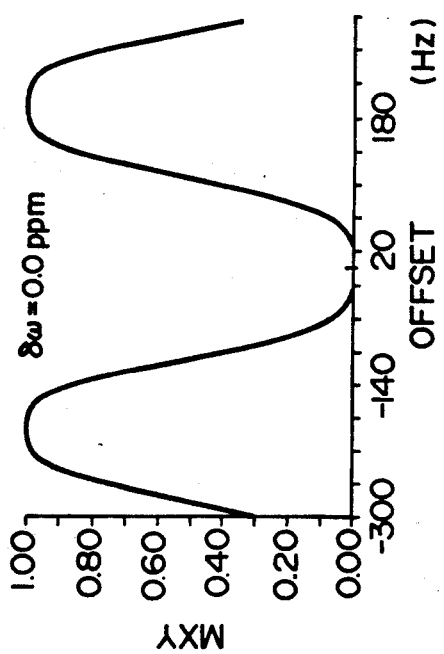
Figure 6D:
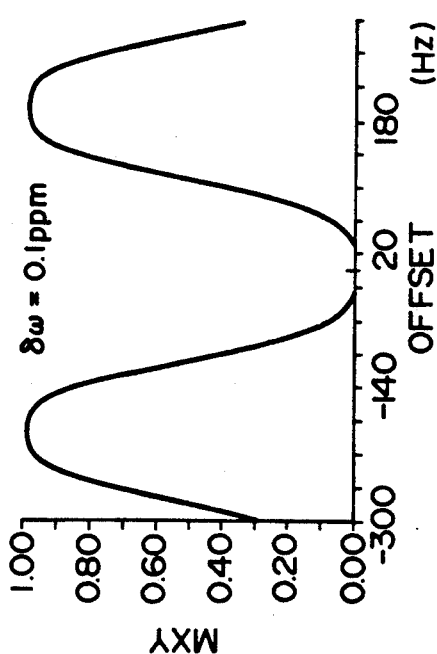
Figure 7A:
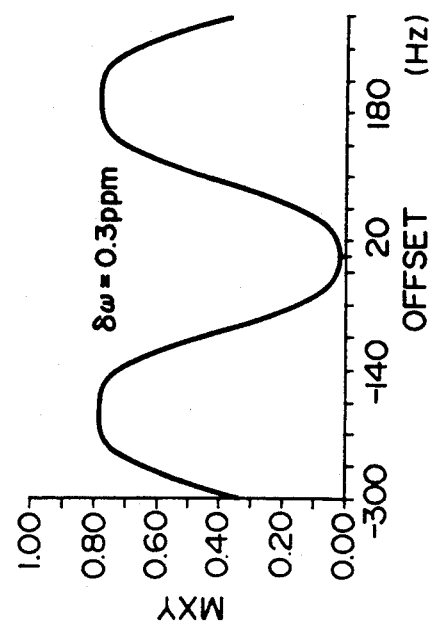
FIGS. 7A to 7D are diagrams of the transverse magnetizations measured in accordance with the degree of inhomogeneity of a static magnetic field in the conventional method.
Figure 7B:
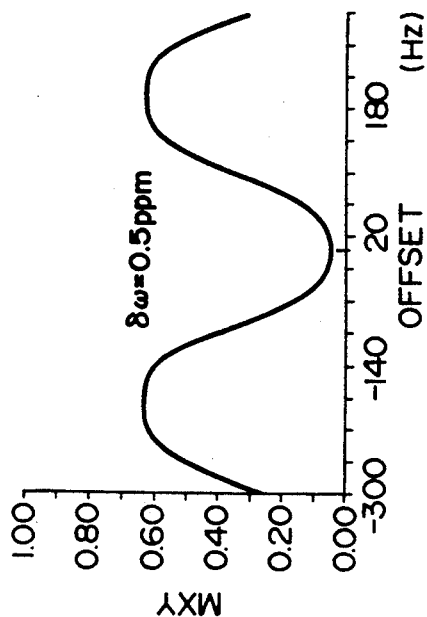
Figure 7C:
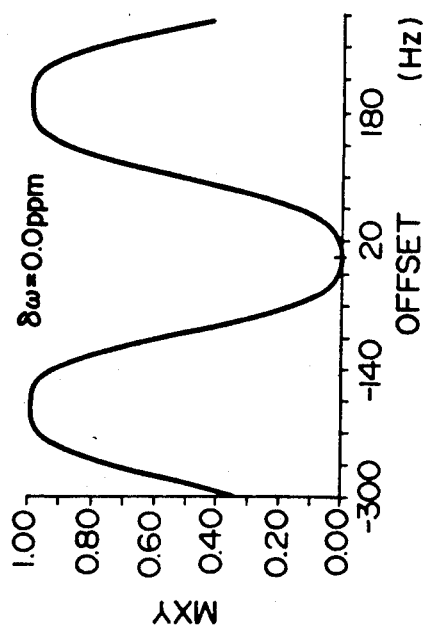
Figure 7D:
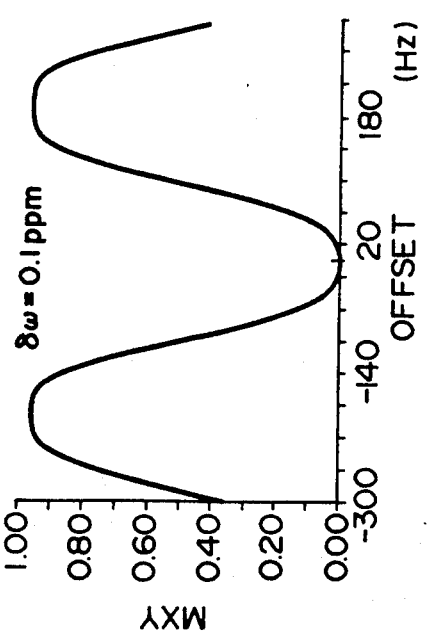

On the other hand, FIGS. 5A to 5D show the behavior of the nuclear magnetizations M of the low concentration solutes generating the phase difference $\pi$ in the period of the pulse interval $\tau$, that is, the nuclear magnetizations M of the protons of the solutes which are measured at the highest sensitivity. At the static field intensity described already, the solutes having the resonance frequency difference of about 190 Hz to water correspond to these solutes. The left side figure of each drawing shows the direction of the nuclear magnetization M on a rotating coordinates system (x, y, z) rotating at the nuclear magnetic resonance frequency of the proton of the water molecule with the Z axis as the direction of the static magnetic field being the center. The right side figure of each drawing represents the component of this nuclear magnetization M on the x - y plane, or in other words, the transverse magnetization Mxy. In the sequence shown in FIG. 1, the phase of each RF pulse is set to x or $-x$. In other words, each RF pulse flips the magnetization either clockwise or counter-clockwise with the x axis of the rotating coordinates system described above being the center. Furthermore, the nuclear magnetization generates the phase difference $\tau$ during the time $\tau$ under the static magnetic field Ho. accordingly, if the static magnetic field is completely homogeneous, the nuclear magnetization M has only the y - z plane components at the point of time when the application of the first RF pulse sequence is completed (FIG. 1 - ①). Practically, however, the direction of the nuclear magnetization M at the time ① becomes such as shown in FIG. 5A due to inhomogeneity of the static magnetic field, and the y - z plane exists in the direction of an angle $\delta\theta$ and the axis component develops as the error component. Next, after the passage of about $\tau$ from the application of the first pulse (FIG. 1 - ②), the magnetization M substantially rotates around the z axis. The error admixes in this period, too, and the angle between M and the y - x plane becomes $\delta\theta + \delta\theta'$ as shown in FIG. 5B. Here, when the inversion pulse $\pi(x)$ is applied, the magnetization M rotates by $\pi$ around the x axis, and assumes the direction shown in FIG. 5C at the point ③. Here, the phase error with the y - z plane inverses to $-(\delta\theta + \delta\theta')$. When the next second pulse sequence is applied, this phase error is sequentially offset. The major proportion of the error ($\delta\theta$ component) are eliminated at the point of completion ④ of the application of the second pulse sequence, and the direction of the magnetization M becomes substantially the y-axis direction. Since this holds true of the magnetizations M at all positions inside the static field coil, phase dispersion hardly exists in the magnetizations M of the sample at the point ④. Accordingly, the nuclear magnetization signals of the low concentration solutes can be measured at the highest sensitivity.

The NMR spectrum has a line width $\Delta\omega$ resulting from the transverse relaxation time $T_2$ and inhomogeneity of the static magnetic field, and its item resulting from inhomogeneity of the static magnetic field will be hereinafter called $\delta\omega$.

FIGS. 6A to 6D show the transverse magnetizations Mxy on the excitation plane obtained in the embodiment shown in FIG. 1 when inhomogeneity $\delta\omega$ of the static magnetic field is 0.0 ppm, 0.1 ppm, 0.3 ppm and 0.5 ppm, respectively. The transverse magnetizations Mxy are normalized by the initial values of the nuclear magnetizations. The abscissa represents the frequency offset using the resonance frequency of water as the reference.

Figure 2:
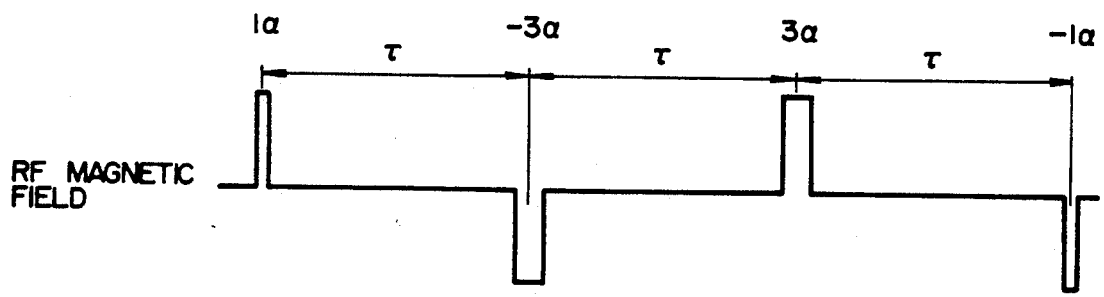
FIG. 2 is a timing chart for the application of radio frequency pulses in accordance with an example of conventional methods.

On the other hand, FIGS. 7A to 7D show the transverse magnetizations Mxy inside the excitation plane obtained by the conventional pulse sequence for the respective inhomogeneity of the static magnetic field for the purpose of comparison with FIGS. 6A to 6D, respectively. By the way, the flip angle $\alpha$ in FIG. 2 is set to $\pi/16$ and the sum of the absolute values of the flip angles is set to $\pi/2$ in the same way as in the embodiment shown in FIG. 1. When FIGS. 7A to 7D are compared with FIGS. 6A to 6D, it can be appreciated that the transverse magnetization signals near the frequency offset=0 tend to increase with the increase in inhomogeneity of the static magnetic field in either of the pulse sequences, but this increase is extremely smaller in this embodiment than in the conventional sequence. In other words, the transverse magnetization signals in the null region are very small in this embodiment even when inhomogeneity of the static magnetic field exists, and the suppression of the signals of the water molecule is made effectively. On the other hand, the transverse magnetizations near the frequency offset of 190 Hz or $-190$ Hz or in other words, in the excitation region, decrease with the increase in inhomogeneity of the static magnetic field, but the degree of this decrease is smaller in this embodiment than in the conventional example. This means that the signals of the low concentration solutes can be obtained with a high sensitivity.

Figure 8:
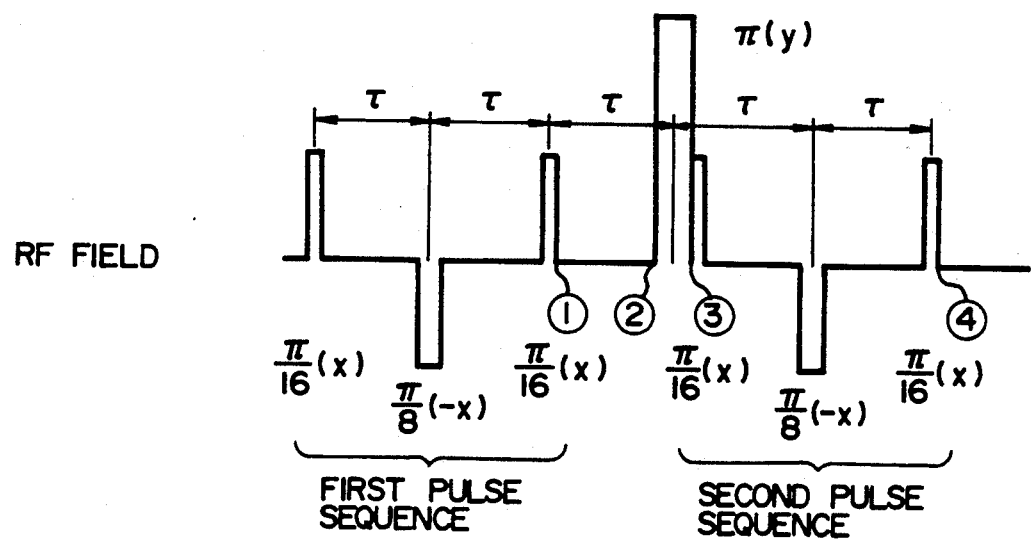
FIG. 8 is a timing chart for the application of a radio frequency pulse in another embodiment of the present invention.
Figure 9A:
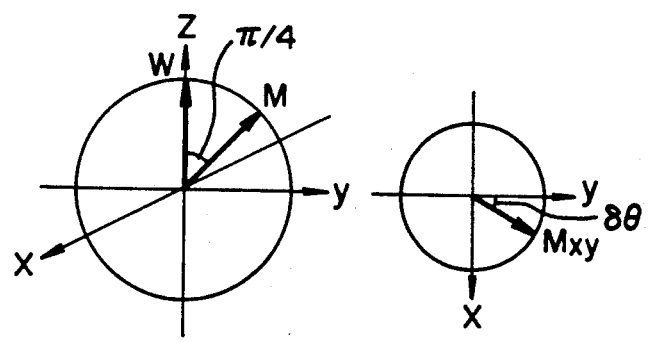
FIGS. 9A to 9D show the trajectory of the nuclear magnetization vector of the low concentration solutes when the embodiment of the invention shown in FIG. 8 is executed.
Figure 9B:
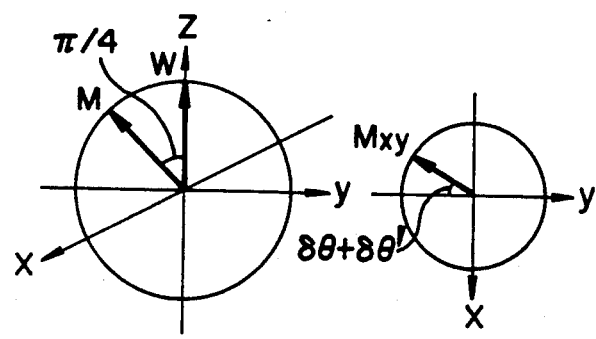
Figure 9C:
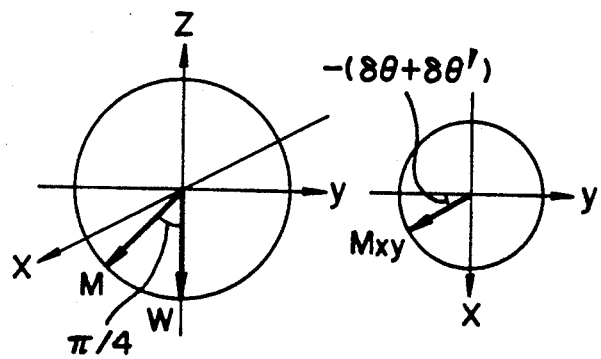
Figure 9D:
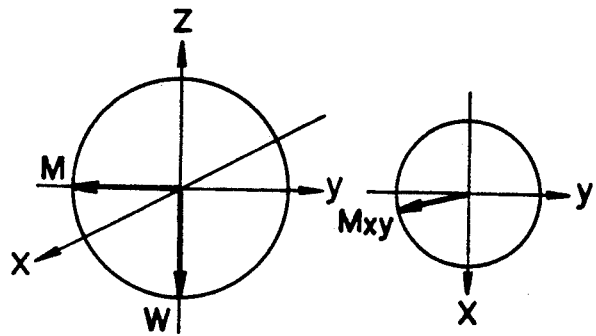
Figure 10A:
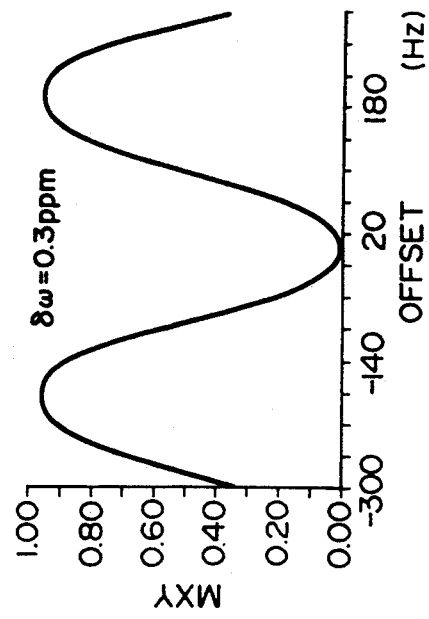
FIGS. 10A to 10D are diagrams of the transverse magnetizations measured by the sequence shown in FIG. 8 in accordance with the degree of inhomogeneity of the static magnetic field.
Figure 10B:
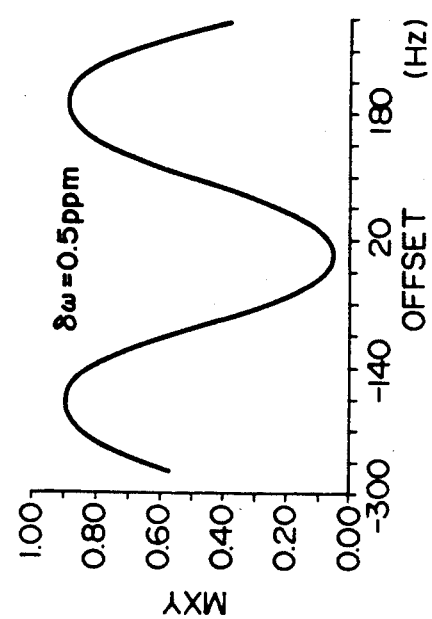
Figure 10C:
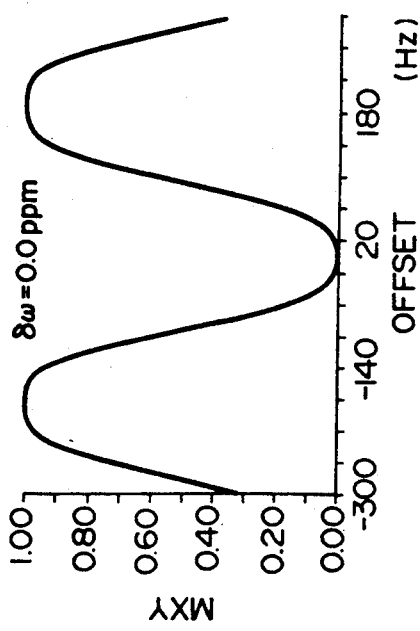
Figure 10D:
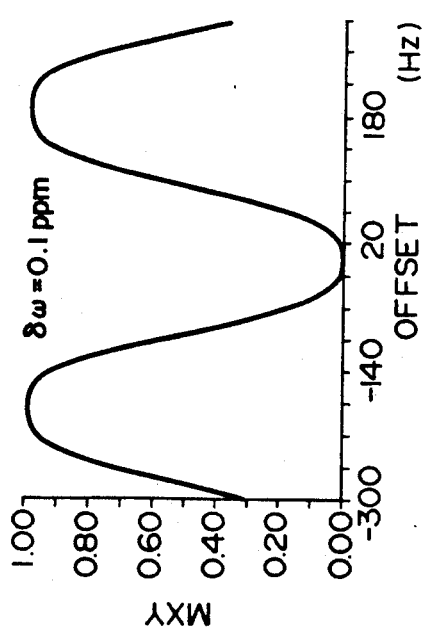

FIG. 8 shows the pulse sequence of another embodiment of the present invention. This embodiment uses $\pi/16(x)-\tau-\pi/8(-x)-\tau-\pi/16(x)$ as the first pulse sequence. An inversion pulse $\pi(y)$, that is, a 180° RF pulse having a 90° phase difference from each pulse of the first pulse sequence, is applied immediately before the passage of $\tau$ from completion of the application of the first pulse sequence. Next, $\pi/16(x)-\tau-\pi/8(-x)-\tau-\pi/16(x)$, which is exactly the same as the first pulse sequence, is applied as the second pulse sequence. In other words, the pulse sequence having the flip angle expressed by 1 $\bar{2}$ 1 is repeatedly applied twice while interposing the inversion pulse. If the pulse interval $\tau$ and the condition of the static field intensity Ho are the same as those of FIG. 1, the behaviors of the magnetizations M of the low concentration solutes having the frequency offset of 190 Hz with water are shown in FIGS. 9A to 9D. In the rotation coordinates system (x, y, z), the direction of the magnetization M is flipped by $\pi/4$ by the first pulse sequence and at the point ① shown in FIG. 8, the direction becomes such as the one shown in FIG. 10A. If any inhomogeneity exists in the static magnetic field Ho, the magnetization M at the point ① has a phase error from the y-z plane due to this inhomogeneity. The direction of the magnetization M rotates to the direction shown in FIG. 9B at the point ② immediately before the passage of the time $\tau$ from completion of the application of the first pulse sequence and the phase error increases to $(\delta\theta+\delta\theta')$. If the $\pi(y)$ pulse is applied at this time, the magnetization M rotates by 180° round the y axis and assumes the direction shown in FIG. 9C at the point ③. Since the second pulse sequence is the same as the first pulse sequence, the phase error is offset substantially completely at the point ④ at which its application is completed, and the magnetization M directs substantially in the -y direction. Accordingly, the phases of the low concentration solutes are substantially free from phase dispersion at the time of signal measurement, and large transverse magnetization signals can be obtained. On the other hand, similar offset of the phase error is made for the magnetization W of the water molecule and the magnetization W directs substantially completely in the $-Z$ direction at the point of completion of the application of the second pulse sequence notwithstanding inhomogeneity of the static magnetic field.

FIGS. 10A to 10D show the transverse magentizations Mxy obtained by the measuring method of this embodiment when inhomogeneity of the static magnetic field $\delta\omega$ is 0.0 ppm, 0.1 ppm, 0.3 ppm and 0.5 ppm, respectively. For comparison, FIGS. 11A to 11D show the transverse magnetizations obtained a pulse sequence having one 1 $\bar{2}$ 1 pulse sequence (with the sum of the absolute values of the flip angles being $\pi/2$). It can be understood that in this embodiment, too, signal suppression in the null region and the signal increase in the excitation region are achieved effectively irrespective of inhomogeneity of the static magnetic field.

Although the functions of the embodiments using two kinds of pulse sequences have been definitely described, the present invention is in no way limited thereto, and the following will illustrate some of the effective combinations of the first pulse sequence, the inversion pulse and the second pulse sequence.

Figure 12:
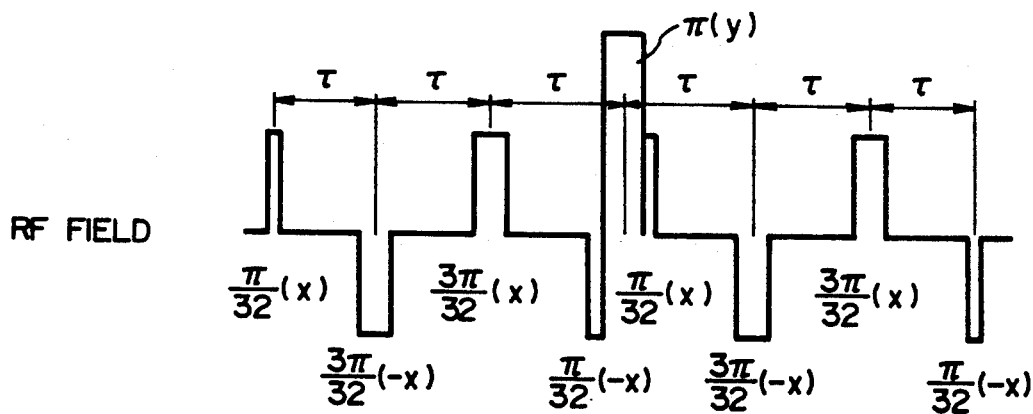
FIGS. 12 to 23 are timing charts for the applications of the radio frequency pulses in other embodiments of the present invention, respectively.

(1) The first and second pulse sequences comprise even-numbered RF pulses and are equal to each other, and the $\pi$ pulses and the second pulse sequence are sequentially applied without any interval from completion of the application of the first pulse sequence. The $\pi$ pulse has a 90° phase difference from the pulses of each of the first and second pulse sequences. A definite example is given below:

$$\pi/32(x) - \tau - 3\pi/32(-x) - \tau - 3\pi/32(x) - \tau - \pi/32(-x) \cdot$$
$$\pi(y) \cdot \pi/32(x) - \tau - 3\pi/32(-x) - 3\pi/32(x) - \tau -$$
$$\pi/32(-x) \ldots \text{see FIG. 12}$$

Figure 13:
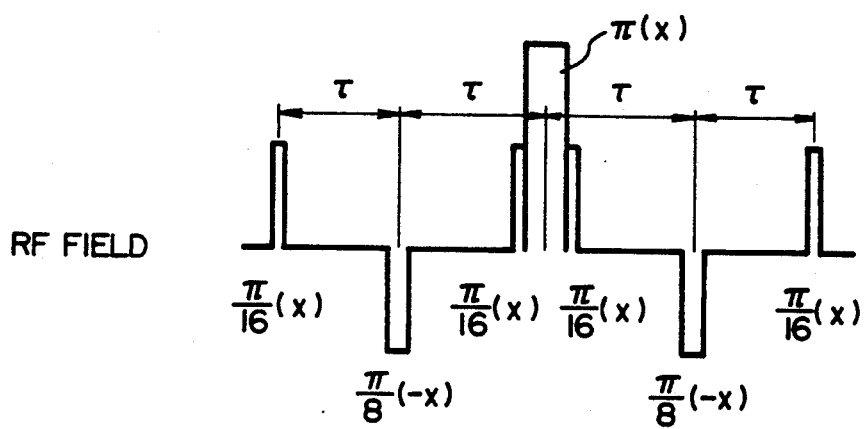

(2) The first and second pulse sequences comprise odd-numbered RF pulses and are equal to each other, and the $\pi$ pulses and the second pulse sequence are sequentially applied without any interval from completion of the application of the first pulse sequence. The $\pi/2$ pulse has the same phase as the first and second pulse sequences. A definite example is given below:

$$\pi/16(x) - \tau - \pi/8(-x) - \tau - \underline{\pi/16(x) \cdot \pi(x) \cdot \pi/16(x)} - \tau -$$
$$\pi/8(-x) - \tau - \pi/16(x) \ldots \text{see FIG. 13.}$$

The underlined three pulses may be replaced altogether by a $9\pi/8(x)$ pulse.

Figure 14:
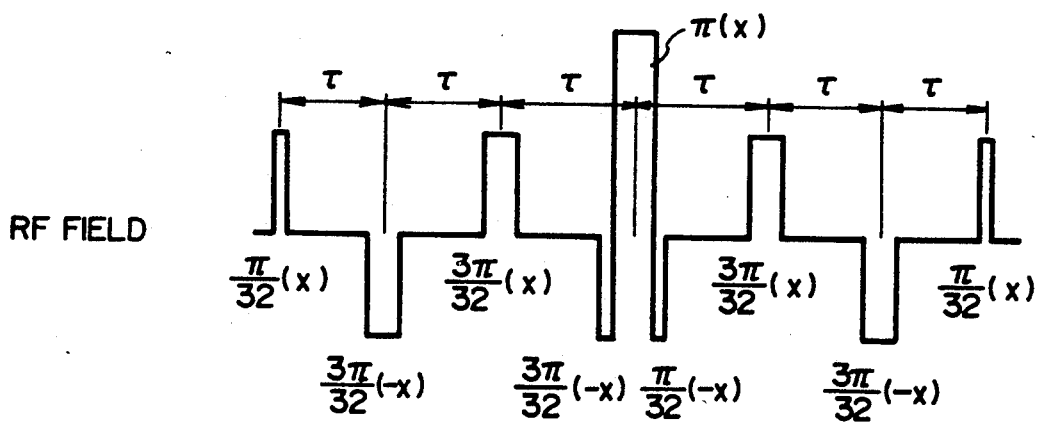

(3) The first and second pulse sequences comprise even-numbered RF pulses but have mutually opposite phases, and the $\pi$ pulses and the second pulse sequence are sequentially applied without any interval from completion of the application of the first pulse sequence. The $\pi$ pulse has the same phase as each pulse of the first and second pulse sequences. A definite example is given below:

$$\pi/32(x) - \tau - 3\pi/32(-x) - \tau - 3\pi/32(x) - \tau -$$

$$\underline{\pi/32(-x) \cdot \pi(x) \cdot \pi/32(-x)} - \tau - 3\pi/32(x) - \tau -$$

$$3\pi/32(-x) - \pi/32(x) \ldots \text{see FIG. 14.}$$

The underlined three pulses may be replaced altogether by a $15\pi/16(x)$.

Figure 15:
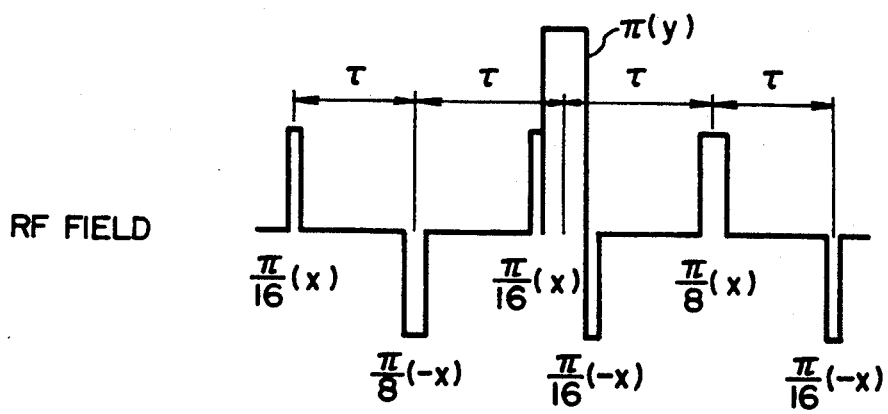

(4) The first and second pulse sequences comprise odd-numbered RF pulses but have mutually opposite phases, and the $\pi$ pulses and the second pulse sequence are sequentially applied without any interval from completion of the application of the first pulse sequence. The $\pi$ pulse has substantially a 90° phase difference from each pulse of the first and second pulse sequences. A definite example is given below:

$$\pi/16(x) - \tau - \pi/8(-x) - \tau - \underline{\pi/16(x) \cdot \pi(y) \cdot \pi/16(-x)} -$$

$$\tau - \pi/8(x) - \tau - \pi/16(-x) \ldots \text{see FIG. 15}$$

The underlined three pulses may be replaced by the $\pi(y)$ pulse because they are equivalent to the latter.

Figure 16:
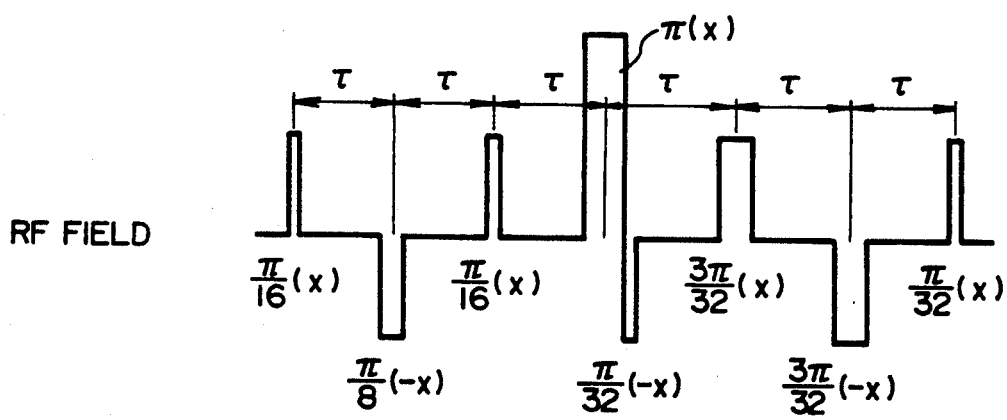

(5) The first pulse sequence comprises odd-numbered pulses and the second pulse sequence comprises even-numbered and a greater number of pulses than the number of pulses of the first pulse sequence. The initial RF pulses of both of these pulse sequences have mutually opposite phases. The second pulse sequence is applied with a pulse interval $\tau$ from completion of the application of the first pulse sequence, and the $\pi$ pulse is applied immediately before the second pulse sequence. The $\pi$ pulse has the same phase as each pulse of the first and second pulse sequences. A definite example is given below:

$$\pi/16(x) - \tau - \pi/8(-x) - \tau - \pi/16(x) - \tau -$$

$$\underline{\pi(x) \cdot \pi/32(-x)} - \tau - 3\pi/32(x) - \tau -$$

$$3\pi/32(-x) - \tau - \pi/32(x) \ldots \text{see FIG. 16}$$

The underlined pulses may be replaced by a $31\pi/32(x)$ because they are equivalent to the latter.

Figure 17:
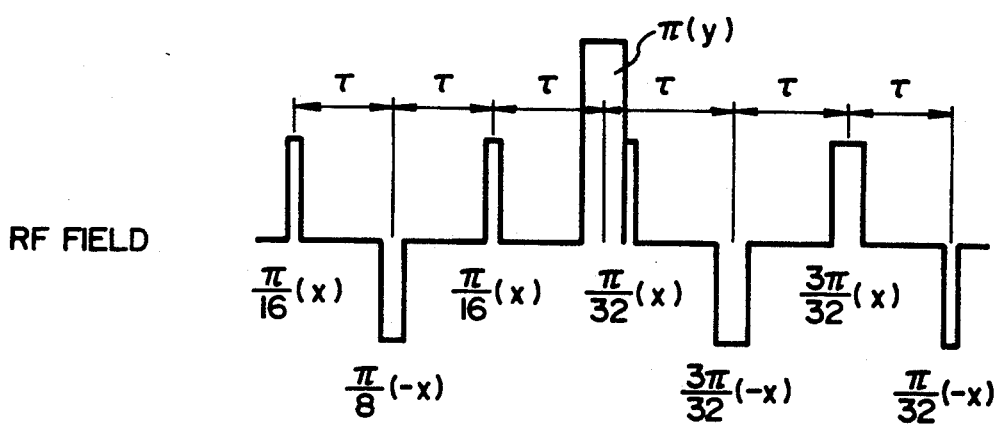

(6) The first pulse sequence comprises odd-numbered pulses and the second pulse sequence comprises even-numbered and a greater number of pulses than the pulses of the first pulse sequence. The initial RF pulses of both of these pulse sequences have the same phase. The second pulse sequence is applied with the pulse interval $\tau$ from completion of the application of the first pulse sequence and the $\pi$ pulse is applied immediately before the second pulse sequence. The $\pi$ pulse has the 90° phase difference from each pulse of the first and second pulse sequences. A definite example is given below:

$$\pi/16(x) - \tau - \pi/8(-x) - \tau - \pi/16(x) - \tau -$$

$$\pi(y) \cdot \pi/32(x) - \tau - 3\pi/32(-x) - \tau - 3\pi/32(x) -$$

$$\tau - \pi/32(-x) \ldots \text{see FIG. 17}$$

Figure 18:
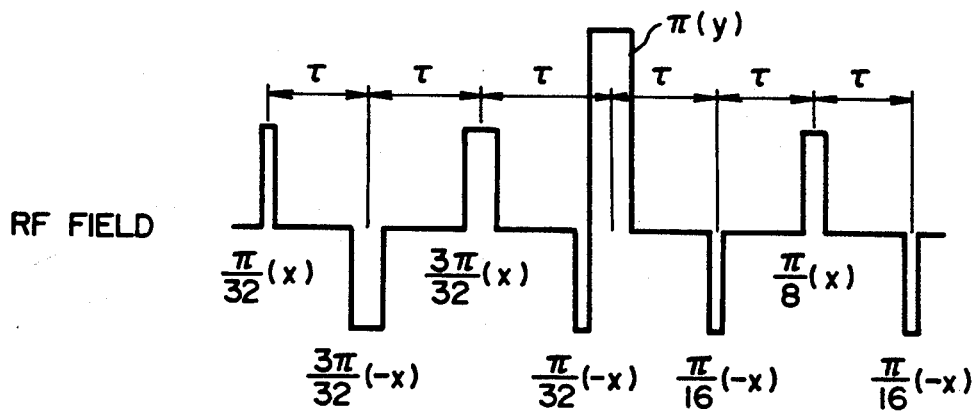

(7) The first pulse sequence comprises even-numbered pulses and the second pulse sequence comprises odd-numbered and a smaller number of pulses than the pulses of the first pulse sequence. The initial RF pulses of both of these pulse sequences have mutually opposite phases. The $\pi$ pulse is applied immediately after completion of the application of the first pulse sequence, and then the second pulse sequence is applied with the interval $\tau$. The $\pi$ pulse has the 90° phase difference from each pulse of the first and second pulse sequences. A definite example is given below:

$$\pi/32(x) - \tau - 3\pi/32(-x) - \tau - 3\pi/32(x) - \tau -$$

$$\pi/32(-x) \cdot \pi(y) - \tau - \pi/16(-x) - \tau - \pi/8(x) -$$

$$\tau - \pi/16(-x) \ldots \text{see FIG. 18}$$

Figure 19:
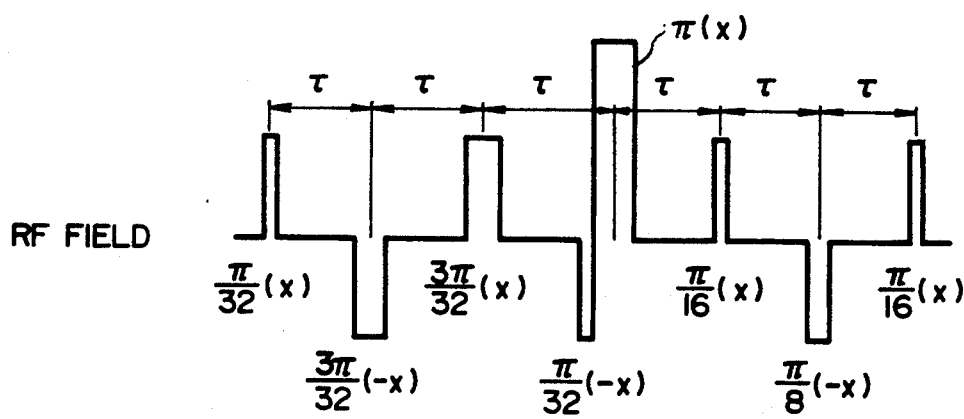

(8) The first pulse sequence comprises even-numbered RF pulses, the second pulse sequence comprises odd-numbered and a smaller number of RF pulses than the first pulse sequence, and the initial pulses of both of the first and second pulse sequences have mutually the same phase. The $\pi$ pulse is applied immediately after completion of the application of the first pulse sequence and then, the second pulse sequence with the interval $\tau$. The $\pi$ pulse has the same phase as that of each pulse of the first and second pulse sequence. A definite example is given below:

$$\pi/32(x) - \tau - 3\pi/32(-x) - \tau - 3\pi/32(x) - \tau -$$

$$\underline{\pi/32(-x) \cdot \pi(x)} - \tau - \pi/16(x) - \tau -$$

$$\pi/8(-x) - \tau - \pi/16(x) \ldots \text{see FIG. 19}$$

The underlined portion is equivalent to the $31\pi/32(x)$ and can be replaced by the latter.

Figure 20:
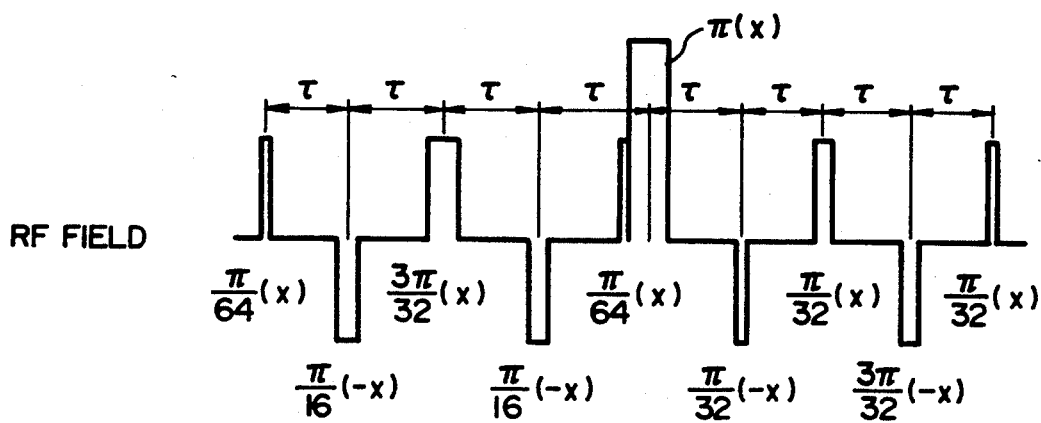

(9) The first pulse sequence comprises odd-numbered RF pulses, the second pulse sequence comprises even-numbered and a smaller number of RF pulses than the first pulse sequence and the initial pulses of both of these pulse sequences have mutually opposite phases. The $\pi$ pulse is applied immediately after completion of the application of the first pulse sequence and then, the second pulse with the interval $\tau$. The $\pi$ pulse has the same phase as each pulse of the first and second pulse sequences. A definite example is given below:

$$\pi/64(x) - \tau - \pi/16(-x) - \tau - 3\pi/32(x) - \tau - \pi/16(-x) -$$

$$\tau - \underline{\pi/64(x) \cdot \pi(x)} - \tau - \pi/32(-x) - \tau - 3\pi/32(x) - \tau -$$

$$3\pi/32(-x) - \tau - \pi/32(x) \ldots \text{see FIG. 20}$$

The underlined portion is equivalent to $65\pi/64(x)$ and may be replaced by it.

Figure 21:
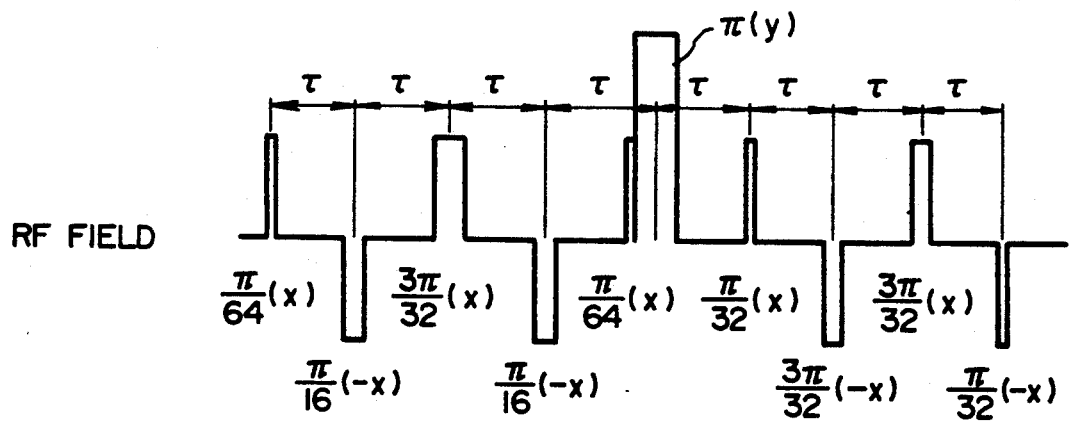

(10) The first pulse sequence comprises odd-numbered RF pulses, the second pulse sequence comprises even-numbered and a smaller number of pulses than the first pulse sequence and the initial RF pulses of both of these pulse sequences have the same phase. The $\pi$ pulse is applied immediately after completion of the application of the first pulse sequence and then, the second pulse sequence with the interval $\tau$. The $\pi$ pulse has the 90° phase difference from each RF pulse of the first and second pulse sequences. A definite example is given below:

$\pi/64(x) - \tau - \pi/16(-x) - \tau - 3\pi/32(x) - \tau - \pi/16(-x) -$ $\tau - \pi/64(x) \cdot \pi(y) - \tau - \pi/32(x) - \tau - 3\pi/32(-x) - \tau -$ $3\pi/32(x) - \tau - \pi/32(-x) \ldots$ see FIG. 21

Figure 22:
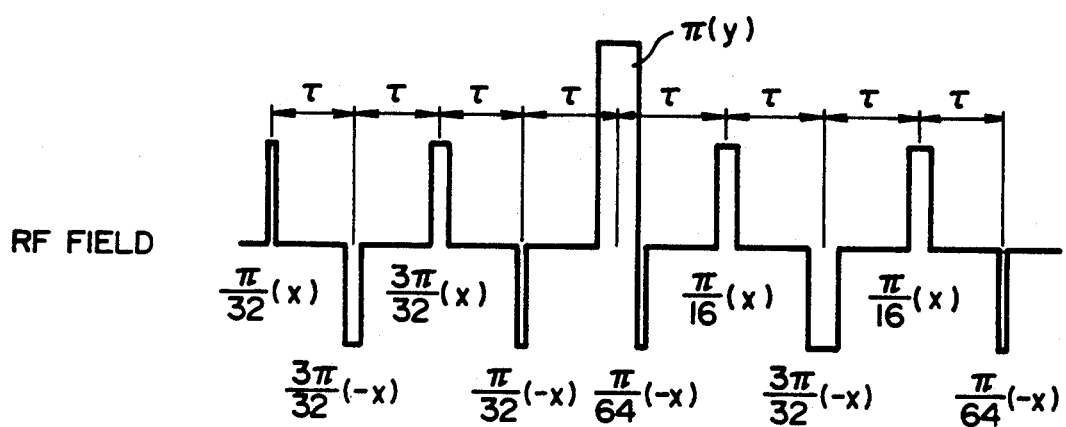

(11) The first pulse sequence comprises even-numbered RF pulses, the second pulse sequence comprises odd-numbered and a greater number of RF pulses than the first pulse sequence and the initial RF pulses of both of these pulse sequences have mutually opposite phases. The second pulse sequence is applied with the interval $\tau$ from completion of the application of the first pulse sequence and the $\pi$ pulse is applied immediately before the second pulse sequence. The $\pi$ pulse has the 90° phase difference from each pulse of the first and second pulse sequences. A definite example is given below:

$\pi/32(x) - \tau - 3\pi/32(-x) - \tau - 3\pi/32(x) - \tau - \pi/32(-x) -$ $\tau - \pi(y) \cdot \pi/64(-x) - \tau - \pi/16(x) - \tau - 3\pi/32(-x) - \tau -$ $\pi/16(x) - \tau - \pi/64(-x) \ldots$ see FIG. 22

Figure 23:
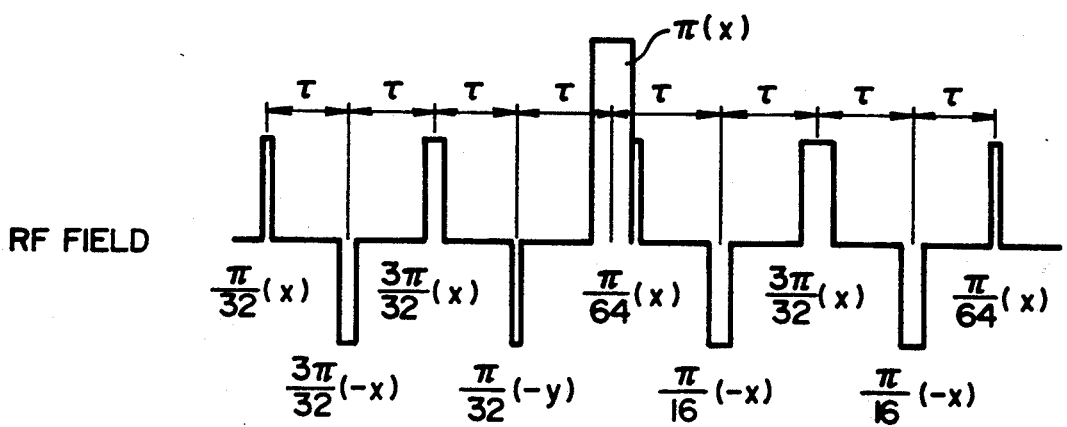

(12) The first pulse sequence comprises even-numbered RF pulses, the second pulse sequence comprises even-numbered and a greater number of RF pulses than the first pulse sequence, and the initial RF pulses of both of these pulse sequences have the same phase. The second pulse sequence is applied with the interval $\tau$ from completion of the application of the first pulse sequence and the $\pi$ pulse is applied immediately before the second pulse sequence. The $\pi$ pulse has the same phase as each RF pulse of the first and second pulse sequence. A definite example is given below:

$\pi/32(x) - \tau - 3\pi/32(-x) - \tau - 3\pi/32(x) - \tau -$ $\pi/32(-x) - \tau - \underline{\pi(x) \cdot \pi/64(x)} - \tau - \pi/16(-x) -$ $\tau - 3\pi/32(x) - \tau - \pi/16(-x) - \tau - \pi/64(x) \ldots$ see FIG. 23.

The underlined portion is equivalent to $65\pi/64(x)$ pulse and may be replaced by the latter.

We claim:

1. A nuclear magnetic resonance measuring method of an object placed in a space to which a static magnetic field having slight inhomogeneity is applied, said method comprising the steps of:
   applying a first equidistant radio frequency pulse sequence the phases of which are inversed sequentially and which has a flip angle ratio in accordance with a binominal coefficient, to said object;
   applying consecutively an inversion radio frequency pulse to said object;
   applying further a second equidistant radio frequency pulse sequence the phases of which are inversed sequentially and which has a flip angle ratio in accordance with a binominal coefficient, to said object; and
   measuring transverse magnetization signals resulting from said object.

2. A nuclear magnetic resonance measuring method according to claim 1, wherein the sum of the first sum of the absolute value of the flip angle of each pulse of said first radio frequency pulse sequence and the second sum of the absolute value of the flip angle of each pulse of said second radio frequency pulse sequence is substantially $\pi/2$.

3. A nuclear magnetic resonance measuring method according to claim 1, wherein the first sum of the absolute value of the flip angle of each pulse of said first radio frequency pulse sequence is substantially equal to the second sum of the absolute value of the flip angle of each pulse of said second radio frequency pulse sequence.

4. A nuclear magnetic resonance measuring method according to claim 3, wherein each of said first and second sums is substantially $\pi/4$.

5. A nuclear magnetic resonance measuring method according to claim 1, wherein the number of pulses of said first radio frequency pulse sequence is equal to the number of pulses of said second radio frequency pulse sequence or has a difference of 1 from the latter.

6. A nuclear magnetic resonance measuring method according to claim 1, wherein each of said first and second pulse sequence is the pulse sequence which comprises even-numbered radio frequency pulses and has the same phase, said inversion radio frequency pulse and said second radio frequency pulses are consecutively applied after the passage of a predetermined time from completion of the application of said first radio frequency pulse sequence, and said inversion radio frequency pulse has the same phase as that of the pulses of either one of said first and second radio frequency pulse sequences.

7. A nuclear magnetic resonance measuring method according to claim 1, wherein each of said first and second pulse sequences is the pulse sequence which comprises odd-numbered radio frequency pulses and has the same phase, said inversion radio frequency pulse and said second radio frequency pulse sequence are consecutively applied after the passage of a predetermined time from completion of the application of said first radio frequency pulse sequence, and said inversion radio frequency pulse has a phase difference of 90° from each pulse of said first and second radio frequency sequences.

8. A nuclear magnetic resonance measuring method according to claim 1, wherein said first radio frequency sequence comprises odd-numbered radio frequency pulses, the phase of the first pulse of said second radio frequency pulse sequence is opposite to the phase of the first pulse of said first radio frequency pulse sequence, said second radio frequency sequence comprises even-numbered radio frequency pulses, and said inversion radio frequency pulse has the same phase as that of the pulses of either one of said first and second radio frequency pulse sequences.

9. A nuclear magnetic resonance measuring method according to claim 1, wherein said first radio frequency pulse sequence comprises odd-numbered radio frequency pulses, the first pulse of said second radio frequency pulse sequence has the same phase as the first pulse of said first radio frequency pulse sequence, said second radio frequency pulse sequence comprises even-numbered radio frequency pulses, and said inversion radio frequency pulse has a phase difference of 90° from each pulse of said first and second radio frequency pulse sequences.

10. A nuclear magnetic resonance measuring method according to claim 1, wherein said first radio frequency pulse sequence comprises even-numbered radio frequency pulses, the first pulse of said second radio frequency pulse sequence has an opposite phase to the first pulse of said first radio frequency pulse sequence, said second radio frequency pulse sequence comprises odd-numbered radio frequency pulses, and said inversion radio frequency pulse has the same phase as any of the pulses of said first radio frequency pulse sequence.

11. A nuclear magnetic resonance measuring method according to claim 1, wherein said second radio frequency pulse sequence comprises a greater number of pulses than said first radio frequency pulse sequence, and said inversion radio frequency pulse is applied immediately before the start of the application of said second radio frequency pulse sequence while keeping an interval from completion of the application of said first radio frequency pulse sequence.

12. A nuclear magentic resonance measuring method according to claim 1, wherein said second radio frequency pulse sequence comprises a smaller number of pulses than said first radio frequency pulse sequence, and said inversion radio frequency pulse is applied immediately after completion of the application of said first radio frequency pulse sequence.

* * * * *